United States Patent [19]

Erickson et al.

[11] 4,184,900
[45] Jan. 22, 1980

[54] CONTROL OF MICROSTRUCTURE IN CAST EUTECTIC ARTICLES

[75] Inventors: John S. Erickson, Colchester; Earl R. Thompson, Glastonbury; Patrick M. Curran, Tolland, all of Conn.

[73] Assignee: United Technologies Corporation, Hartford, Conn.

[21] Appl. No.: 830,254

[22] Filed: Sep. 2, 1977

Related U.S. Application Data

[62] Division of Ser. No. 577,260, May 14, 1975, abandoned.

[51] Int. Cl.² ............................................. C22C 19/03
[52] U.S. Cl. ........................................ 148/32; 75/170; 75/171; 148/32.5; 148/39; 416/241 R
[58] Field of Search .................... 148/32, 32.5, 39; 75/171, 170; 416/241 R; 164/127

[56] References Cited

U.S. PATENT DOCUMENTS 3,939,895   2/1976   Sawyer ............................. 164/127

*Primary Examiner*—R. Dean
*Attorney, Agent, or Firm*—Charles E. Sohl

[57] ABSTRACT

This invention concerns a method for controlling the microstructure of directionally solidified eutectic articles and the article produced thereby. The method is particularly appropriate for the production of articles such as turbine blades which require different mechanical properties in different areas of the article. The microstructure is controlled by varying the directional solidification conditions during the casting process.

4 Claims, 8 Drawing Figures

Fig. 5a LAMELLAR
TRANSVERSE  LONGITUDINAL 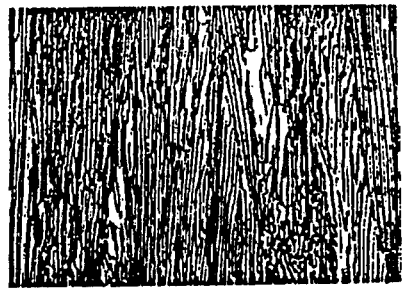
Fig. 5b CELLULAR
TRANSVERSE  LONGITUDINAL 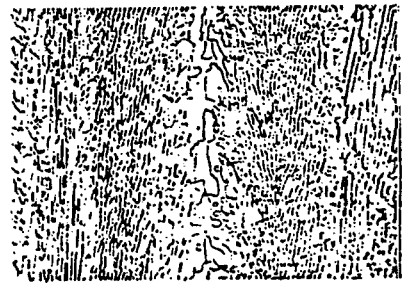
Fig. 6
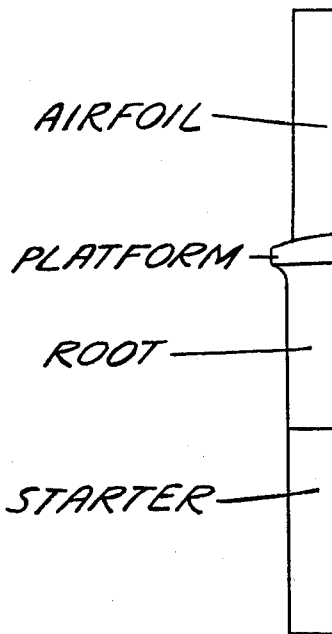
- AIRFOIL
- PLATFORM
- ROOT
- STARTER
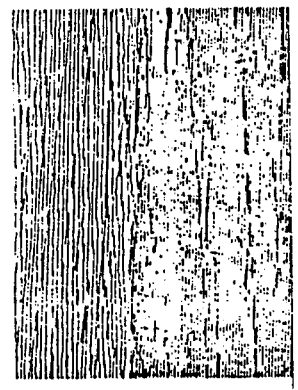

25 X

CONTROL OF MICROSTRUCTURE IN CAST EUTECTIC ARTICLES

The invention described herein was made in the course of, or under a contract or subcontract thereunder with the Department of the Navy.

This is a division of application Ser. No. 577,260, filed May 14, 1975, abandoned.

BACKGROUND OF THE INVENTION

1. Field of the Invention

This invention relates to the fields of directional solidification and directionally solidified cast eutectic articles. Articles made according to the present invention are particularly suited for use in high temperature, high stress applications such as blades and vanes in gas turbine engines.

2. Description of the Prior Art

The metallurgical art has long appreciated the fact that differences in microstructure of a given alloy can result in wide differences in mechanical properties. An example of the importance of microstructure in determining mechanical properties is presented in the field of directionally solidified eutectic alloys. U.S. Pat. No. 3,124,452 issued to Kraft and assigned to the present assignee discloses the production of metallic eutectic alloys having a microstructure consisting of parallel second phase plates, fibers, or rods. Directionally solidified eutectic articles possess extremely high tensile strengths in directions parallel to the microstructural alignment, however, such directionally solidified alloys have anisotropic properties and the tensile strengths of such alloys drop off rapidly when tensile forces are applied in directions which do not coincide with the orientation of the microstructure. Directionally solidified eutectics generally have low elongation values and this lack of ductility can be a serious impediment to the successful application of such materials. U.S. Pat. No. 3,790,303 presents one method by which directionally solidified eutectic articles may be produced having a combination of different properties in different parts of the article. This patent discloses an article in which one portion is directionally solidified producing an aligned eutectic structure with a high degree of alignment and a second portion is a nondirectionally solidified portion having a random microstructural orientation. The specific article described is a gas turbine blade in which the root portion which must be attached to the turbine disk has a non-orientated microstructure and this nonorientated microstructure is claimed to have a relatively high ductility so that the blade may be satisfactorily attached to the disk. The nondirectionally solidified root portion of the article has a microstructure which is commonly referred to as dendritic. The airfoil portion of the article has an aligned microstructure with a high degree of alignment and a resultant claimed high yield strength. Consequently the airfoil portion is able to withstand relatively high stresses which are encountered due to centrifugal forces and gas pressures.

Other U.S. patents in the field of directionally solidified eutectics include U.S. Pat. Nos. 3,434,827; 3,528,808; 3,554,817; 3,564,940; 3,671,223 and 3,793,010, all assigned to the present assignee.

SUMMARY OF THE INVENTION

The present invention includes a eutectic article which is completely directionally solidified but which has portions with different microstructures and different mechanical properties. One portion of the article is directionally solidified under conditions which produce a very high degree of microstructural alignment with the average degree of misalignment being less than 5° and preferably less than 3°. This portion of the article is characterized by high tensile strengths at elevated temperatures and relatively low ductilities. A second portion of the article is directionally solidified under conditions which produce a cellular microstructure in which the individual lamellar plates or fibers are less well aligned with the average misalignment of the individual plates or fibers from the common axis of solidification falling between about 6° and 15°. The cellular microstructure is characterized by having significantly greater ductilities while at the same time having higher mechanical properties than a dendritic or nondirectionally solidified equiaxed type of structure.

The article is produced by directional solidification and the solidification conditions are changed during the process so as to produce the different types of microstructure. The process of the present invention is particularly suited for the production of gas turbine blades in which the root portion which operates at lower temperatures and requires more ductility would be cellular and the airfoil portion which operates at high temperatures and has less need for ductility than would be a completely oriented lamellar or fibrous structure.

The foregoing, and other objects, features and advantages of the present invention will become more apparent in the light of the following detailed description of the preferred embodiment thereof as shown in the accompanying drawings.

BRIEF DESCRIPTION OF THE DRAWINGS

FIG. 5a and 5b shows longitudinal and transverse microstructures in the root and airfoil sections of a eutectic, gas turbine blade produced according to the invention.

FIG. 6 shows longitudinal microstructures taken in the root and airfoil section of a eutectic, gas turbine blade produced according to the present invention.

DESCRIPTION OF THE PREFERRED EMBODIMENTS

Figure 1:
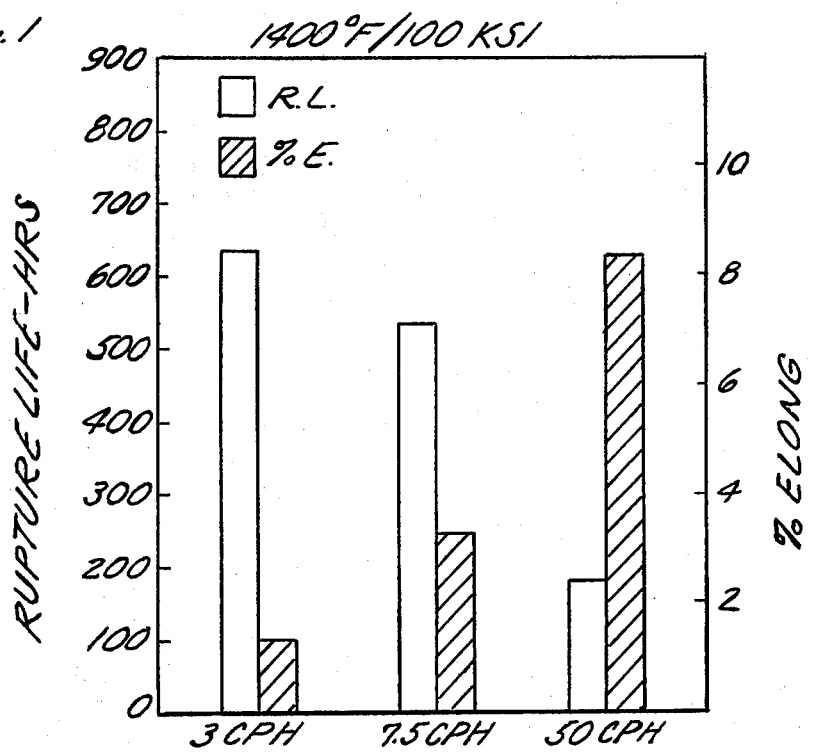
FIG. 1 shows a comparison of the rupture life of a directionally solidified eutectic alloy solidified at different rates, tested at 1400° F./110 ksi.

The present invention concerns the field of directionally solidified eutectics. As used in this application the term eutectic is intended to encompass both monovariant eutectics, bivariant eutectics, and multivariant eutectics and is meant to encompass eutectics involving elements as well as eutectics involving compounds. The present invention is broadly applicable to all types of eutectics, accordingly, the term lamellar, rod like, plate like and fibrous will be generally used interchangeably in the application. In the description which follows, all compositions are given in weight percent unless otherwise specified.

The orientation perfection of a directionally solidified eutectic may be defined as follows:

Consider projections of the normal axes to the second phase regions in a small volume of solidified eutectic. If the eutectic is perfectly aligned these normals will all fall along the equator of the sphere surrounding the volume element, if one considers the growth axis of the eutectic to be the same as the north-south axis of the sphere. At the other extreme, consider a completely non-oriented eutectic structure in which case the projected normals to all the second phase regions in a small volume of solidified eutectic would strike a surrounding sphere with a completely random and uniform distribution.

As a practical matter, a perfectly oriented structure is considered to be one in which the projected normals from the lamellar plates would strike within about 5° of the equator of the surrounding sphere and preferably less; that is to say preferably within about 3° of the equator. A cellular structure is considered to be one in which the projected normals from the lamellar plates in the small volume of solidified eutectic fall within from 6° to 15° of the equator of the surrounding sphere; that is to say about 10° from the equator. In a completely non-oriented eutectic structure the projected normals to second phase planes in a volume of solidified eutectic material would intersect a surrounding sphere at an average angle of 45° from the equator.

In systems studied to date it has been determined that completely oriented microstructures possess optimum yield, tensile and creep rupture strengths at elevated temperatures while cellular microstructures possess lower strengths but much greater ductilities at intermediate and elevated temperatures. Dendritic structures appear to have lower strengths than cellular structures and usually have lower ductilities than the perfectly oriented or cellular structures.

Directionally solidified eutectic structures are generally formed by solidifying molten material of eutectic composition under conditions such that the plane separating solid solidified material from liquid material is substantially uniform and flat and moves along an axis from one portion of the article to another portion of the article. As the rate of solidification increases past a certain critical speed, the interface loses its microscopic flatness and assumes a cusped configuration. This interface configuration leads to the production of a cellular colony microstructure. At still higher speeds, a dendritic growth form may result. Whether a particular solidification condition produces a perfectly oriented or cellular microstructure depends upon the ratio of G to R where G is the thermal gradient in the liquid at the interface and R is the rate of motion of the interface. The preceding discussion applies to directional solidification, when nondirectional solidification occurs and an equiaxed structure results. The particular ratio of G to R at which the microstructure changes from perfectly oriented to cellular is substantially constant for a particular alloy system. The critical ratio of G to R may be readily determined by simple experimental techniques. Nondirectional solidification produces a randomly oriented cellular or dendritic structure.

A turbine blade is made according to the present invention as follows: a ceramic shell investment mold is produced of the desired blade configuration. The lost wax or investment technique may be used to produce the mold. In the following discussion it will be assumed that the bottom portion of the mold, which contacts a chill plate, corresponds to the root of the blade and the upper portion of the mold having the opening through which molten metal may be introduced corresponds to the airfoil portion of the article. Naturally the mold could be produced in an inverted form. It will be further assumed that solidification takes place first in the bottom portion of the mold and moves toward the top portion of the mold. Of course the solidification process could be reversed if means were provided to supply molten metal to the bottom portion of the mold. The mold is preferably preheated to above the melting point of the alloy in question and is then filled with molten metal and maintained at a temperature above the melting point of the eutectic alloy. In order to induce directional solidification the mold is moved through a thermal gradient, from a temperature above the melting point of the alloy to a temperature below the melting point of the alloy, at a particular rate. In the process of the present invention, the rate at which the mold is moved is selected so that the ratio of the thermal gradient G to the rate R will produce a cellular microstructure in the root or bottom portion of the casting. The rate at which the mold is moved through the thermal gradient closely approximates the rate at which the casting solidifies, however, those skilled in the art will appreciate that when the cross sectional area of the cast article changes drastically the rate of movement of the solidification interface will change in a fashion which is not proportional to the motion of the mold. As the solidification interface approaches the junction between the root portion of the article and the blade portion of the article the rate of motion of the mold is decreased to a rate which will produce a completely oriented microstructure in the airfoil portion of the article. Care should be taken to ensure that this transition between cellular and completely oriented microstructure occurs in the root section of the blade which is subject to lower unit stress rather than in the airfoil portion of the article.

As noted above, the parameter which controls the microstructure is the ration of G (thermal gradient) to R (solidification rate). The article of the present invention has a cellular microstructure in one portion and a fully oriented microstructure in at least one other section. One way in which this result may be achieved is by changing the solidification rate R, so as to change the ratio of G to R.

A similar result may be achieved in another, less obvious fashion. Those skilled in the art will appreciate that although the thermal gradient G, at the solidification interface is largely controlled by the external applied thermal gradient, other factors may have some affect. The chief of these other factors is the shape of the cross section of the part being solidified. Under a constant applied external thermal gradient, a steeper internal thermal gradient will result in a part having a thin cross section and a large ratio of surface to volume, than a thick section with a low rate of surface to volume. This fact may be used to produce parts with variable microstructures at a constant solidified rate R, where a fully oriented microstructure is desired in a thin section with a high surface to volume ratio and a cellular microstructure in a thick section with a low rate of surface to volume. To produce this desired result, the solidification rate R must be carefully selected, so that when G is high (thin section) a fully oriented microstructure results and when G is low (thick section) a cellular microstructure results.

Using this approach, R is critical and the process is more difficult to control than one in which R is varied. This approach is also limited to the case where a cellular structure is desirable in a thick section. If R is varied, a fully oriented structure may be obtained in a thick section and a cellular structure may be obtained in a thin section. Accordingly the method in which R is varied is preferred.

It must be emphasized that the process of the present invention involves total directional solidification throughout the complete article as compared with the prior art which suggests uncontrolled dendritic solidification in one portion of the article followed by directional solidification in one portion of the article. Cellular directional solidification has been found to provide mechanical properties superior to those obtained by uncontrolled dendritic solidification.

The invention will be explained further by the following examples, which though illustrative, are not intended to be limitative upon the claims.

EXAMPLE I

Figure 2:
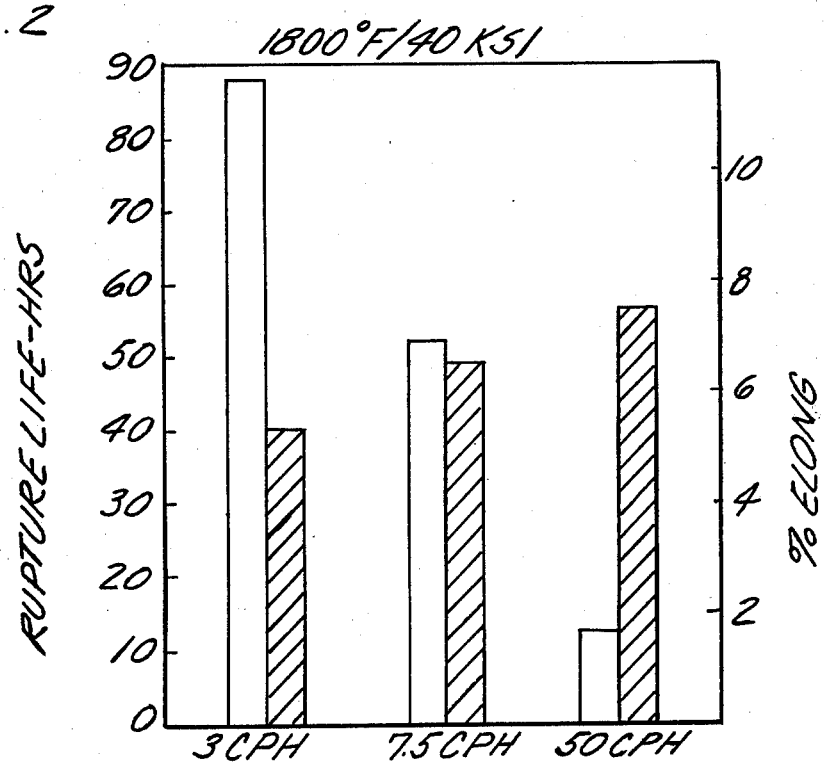
FIG. 2 shows the rupture life of the alloy/conditions shown in FIG. 1, tested at 1800° F./40 ksi.
Figure 3:
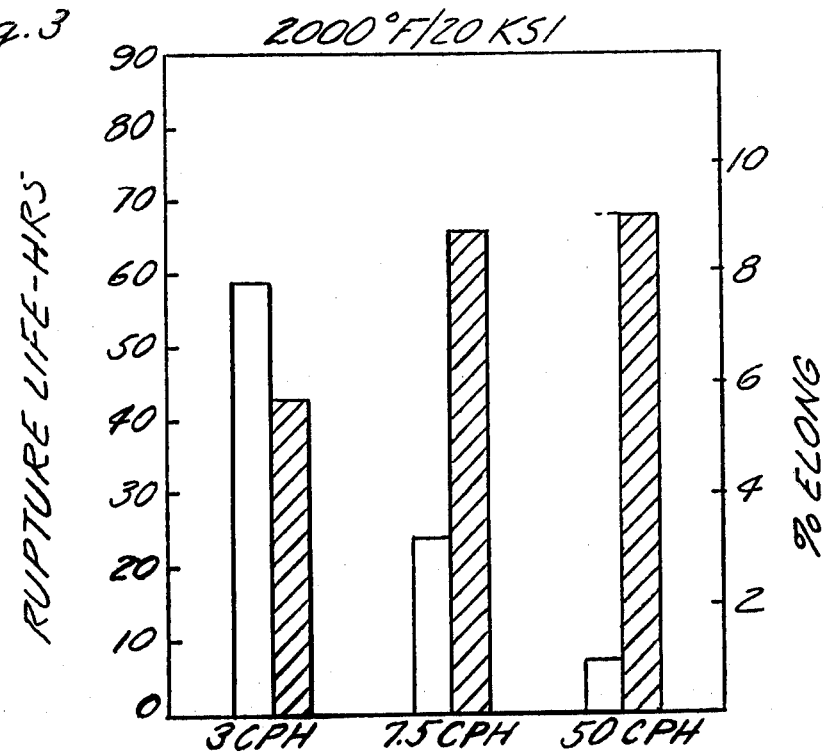
FIG. 3 shows the rupture life of the alloy/conditions shown in FIG. 1, tested at 2000° F./20 ksi.

In this example a nickel base eutectic alloy containing 20% columbium, 6% chromium, and 2½% aluminum was utilized. The structure of this alloy in its solidified state is a gamma nickel solid solution matrix containing a precipitate of gamma prime formed in the solid state and reinforced with a delta ($Ni_3Cb$) second phase. Ceramic shell molds were produced and preheated and were then filled with the molten eutectic which was directionally solidified by withdrawing the molds from a furnace having a hot zone temperature of approximately 3,000° F. The molds were withdrawn through a radiation shield so that a relatively steep temperature gradient could be produced. Three withdrawal rates were used; three centimeters per hour, 7.5 centimeters per hour, and 50 centimeters per hour. The 3 centimeter per hour rate yielded a fully oriented fibrous microstructure while the 7½ centimeter per hour and 50 centimeter per hour withdrawal rates both yielded cellular microstructures. The 50 centimeter per hour withdrawal rage produced a much finer cellular microstructure than the 7½ centimeter per hour withdrawal rate. Samples of these materials were tested to determine creep rupture properties at 1400° F. under a stress of 110,000 psi, at 1800° F. with an applied stress of 40,000 psi and at 2,000° F. with an applied stress of 20,000 psi. The results of these tests are shown in FIGS. 1, 2 and 3. Consideration of these figures shows that the completely oriented fibrous microstructure had significantly less ductility than the cellular microstructure under the three test conditions. The difference is most noticeable at 1400° F. where the completely oriented microstructure had about 1% ductility while the cellular microstructure produced at the 50 centimeter per hour withdrawal rate had a ductility in excess of eight percent. It should be noted that the scale of rupture life in the figures varies from figure to figure. Thus, at 1400° F. the rupture life of the fine cellular structure was about 200 hours as compared with the rupture life of the cellular structure at higher temperatures which was in the range of 60 to 90 hours. In actual operating practice the root portion of the blade operates at significantly lower temperatures than does the blade portion and the root portion is subjected to shear and bending stresses which require a certain amount of ductility. Thus it can be seen that if a blade were made of the alloy by the process of the present example it would possess an extremely desirable combination of mechanical properties in that it would have significantly higher ductilities in the root section which operates in the temperature range of 1400° F. coupled with relatively high rupture strength in the blade portions which operate at higher temperatures and higher stresses.

EXAMPLE II

Figure 4:
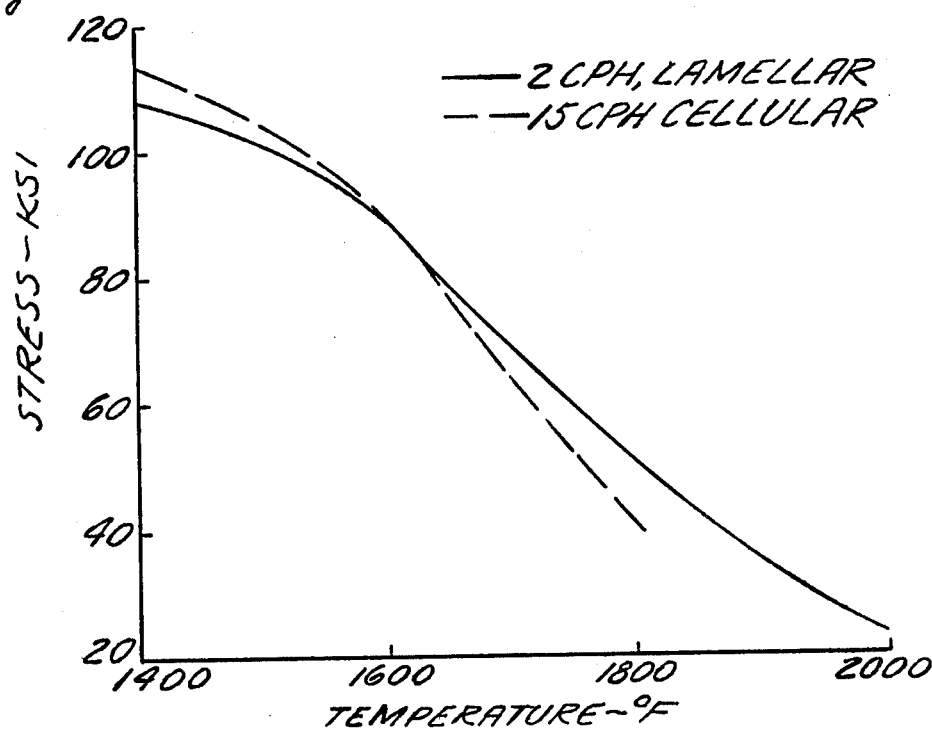
FIG. 4 shows the stress required to produce rupture in 100 hours in a eutectic alloy, directionally solidified so as to produce two different microstructures.

In this example a nickel base alloy containing 23.1% columbium and 4.4% aluminum was utilized. This alloy in its solidified form consists of a gamma prime matrix reinforced by a second phase delta ($Ni_3Cb$) structure in plate like form. Samples of this alloy were directionally solidified in a manner similar to that described for Example 1, by withdrawing them from a heated furnace into a cool zone. It was found that a withdrawal rate of 2 centimeters per hour produced a fully oriented lamellar structure while a withdrawal rate of 15 centimeters per hour produced a fully cellular structure. Several samples of each type structure were tested over a range of temperatures and the stress to produce rupture in 100 hours was determined as a function of temperature for the two types of structures. The stress levels required to produce rupture in 100 hours are shown in FIG. 4. It is evident from consideration of FIG. 4 that the cellular microstructure withstands a higher stress to rupture at temperatures below 1600° F. while the lamellar microstructure produces a higher stress to rupture at temperatures above 1600° F. Since the operating conditions of the blade are such that the root portion operates at a temperature of about 1400° F. while the airfoil portion operates at a temperature of approximately 1800° F. it can be seen that for this particular alloy a superior combination of properties could be produced in the single blade if the root portion had a cellular microstructure and the airfoil portion a lamellar microstructure.

EXAMPLE III

Figure 7:
FIG. 7 shows a representative microstructure of a nondirectionally solidified equiaxed eutectic delta phase reinforced alloy.

A ceramic shell mold was produced using standard commercial practices. The internal mold cavity conformed to a standard blade configuration except that an elongated root section was utilized. The cavity was oriented with the root section down. A gamma prime ($Ni_3Al$) plus delta ($Ni_3Cb$) eutectic alloy (23.1% Cb, 4.4% Al, bal Ni) was melted and poured into the mold which had been preheated to a temperature of 3,000° F. The filled mold was solidified by immersion in a liquid tin bath at a controlled rate. The liquid tin bath was maintained at a temperature of 650° F. The root portion of the mold was immersed at a rate of two inches per hour and the immersion rate was reduced to one inch per hour for solidification of the airfoil section. The solidified blade was etched and examined FIG. 5 shows longitudinal and transverse photomicrographs in the root and airfoil portions of the casting, and shows the cellular and completely oriented lamellar microstructure which resulted. FIG. 6 shows longitudinal photomicrographs and relates them to the position in the blade from which they were taken. The purpose of the elongated root section (labeled starter in FIG. 6) was to ensure a stable and uniform microstructure in the root section. Such a starter portion might not be necessary in a fully developed commercial process; if it were necessary, it would be discarded after solidification. FIG. 7 shows an equiaxed eutectic structure in a delta reinforced alloy which was nondirectionally solidified. The wide differences in orientation of the second phase regions are readily visible.

EXAMPLE IV

Rupture samples were machined from the root and airfoil portions of the article produced in Example III. Samples from the airfoil and root had rupture elongations of 1.06 and 2.19% respectively, when tested at 1400° F./120 KSI. The increased ductility found in the root sample is desirable since it permits the root section to conform to the mounting means without rupturing.

Although the invention has been shown and described with respect to a preferred embodiment thereof, it should be understood by those skilled in the art that various changes and omissions in the form and detail thereof may be made therein without departing from the spirit and the scope of the invention.

Having thus described a typical embodiment of our invention, that which we claim as new and desire to secure by Letters Patent of the United States is:

1. A directionally solidified eutectic article having at least one portion with a cellular microstructure and at least one further portion having a fully oriented fibrous microstructure.

2. An article as in claim 1 in the shape of a turbine blade with an airfoil section with a completely oriented fibrous microstructure and a root section with a cellular microstructure.

3. An article as in claim 2 wherein the completely oriented microstructure has an average degree of misalignment of less than about 5° from the solidification axis and the cellular microstructure has an average degree of misalignment between about 6° and 15° from the solidification axis.

4. An article as in claim 3 composed of a nickel base superalloy eutectic.

* * * * *